United States Patent [19]

Binnig et al.

[11] 4,343,993
[45] Aug. 10, 1982

[54] SCANNING TUNNELING MICROSCOPE

[75] Inventors: Gerd Binnig; Heinrich Rohrer, both of Richterswil, Switzerland

[73] Assignee: International Business Machines Corporation, Armonk, N.Y.

[21] Appl. No.: 186,923

[22] Filed: Sep. 12, 1980

[30] Foreign Application Priority Data

Sep. 20, 1979 [CH] Switzerland .................. 8486/79

[51] Int. Cl.$^3$ .................................................. G01N 23/00
[52] U.S. Cl. .................................. 250/306; 250/423 F
[58] Field of Search .............. 250/306, 307, 441, 457, 250/423 F

[56] References Cited

PUBLICATIONS

"The Topografiner: An Instrument for Measuring Surface Microtopography", Young et al., Review of Sci. Ins., vol. 43, No. 7, Jul. 1972, pp. 999-1011.
"Field-Emission Microscopy from Glass-coated Tips", Rihon, Phys. Stat. Sol(a), vol. 54, No. 1, Jul. 1979, pp. 189-194.
"Field Emission Ultramicrometer", Young, Rev. of Sci. Ins., vol. 37, No. 3, Mar. 1966, pp. 275-278.
"Vacuum—Tunneling Spectroscopy," Plummer et al., Physics Today, vol. 28, No. 4, Apr. 1975, pp. 63-71.

Primary Examiner—Bruce C. Anderson
Attorney, Agent, or Firm—Ronald L. Drumheller

[57] ABSTRACT

The vacuum tunnel effect is utilized to form a scanning tunneling microscope. In an ultra-high vacuum at cryogenic temperature, a fine tip is raster scanned across the surface of a conducting sample at a distance of a few Angstroms. The vertical separation between the tip and sample surface is automatically controlled so as to maintain constant a measured variable which is proportional to the tunnel resistance, such as tunneling current. The position of the tip with respect to the surface is controlled preferably by piezo electric drive means acting in three coordinate directions. The spatial coordinates of the scanning tip are graphically displayed. This is conveniently done by displaying the drive currents or voltages of piezo electric drives.

12 Claims, 15 Drawing Figures

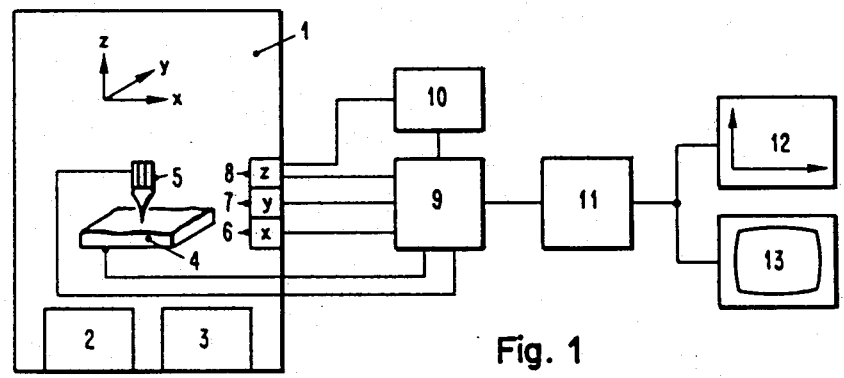
Fig. 1
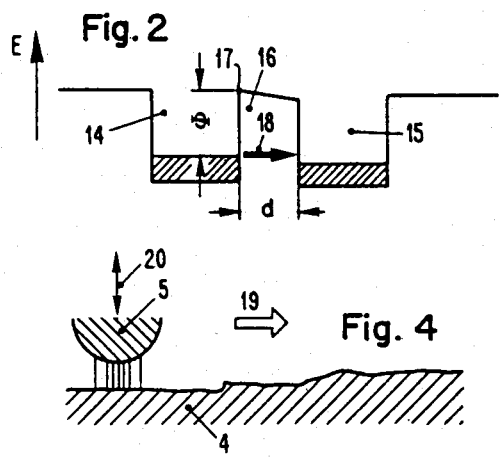
Fig. 2
Fig. 4
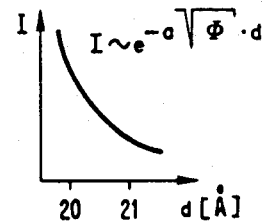
Fig. 3
Fig. 5
Fig. 6
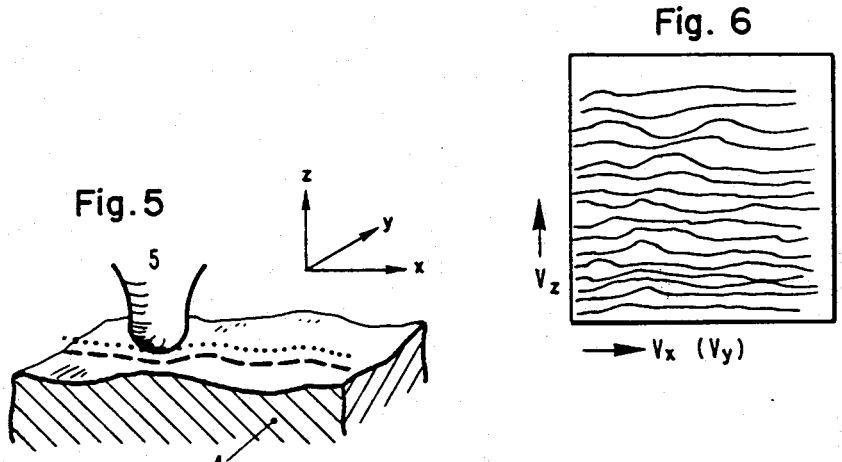

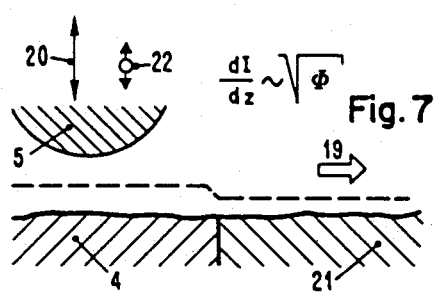
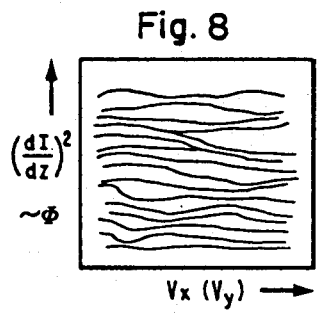
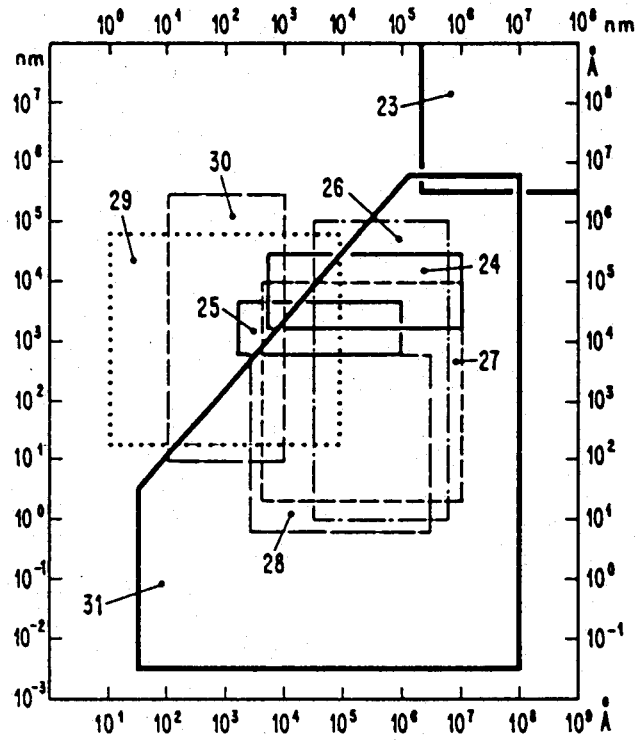
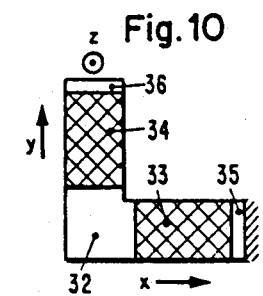
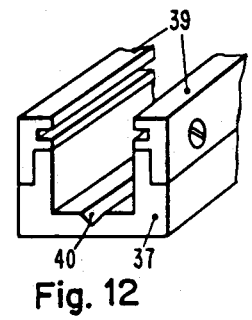
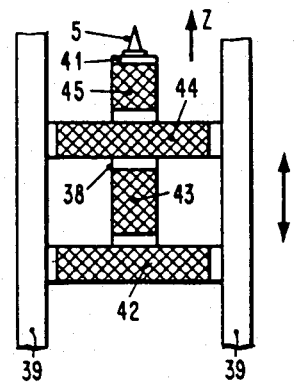
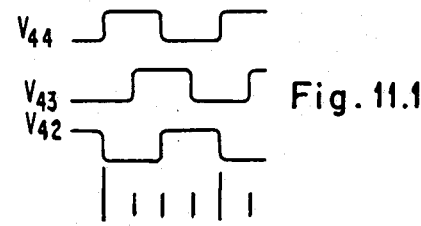

SCANNING TUNNELING MICROSCOPE

DESCRIPTION

This invention relates to apparatus for investigation of surface structures utilizing the vacuum tunnel effect. An ultra-high vacuum chamber is cooled down to a cryogenic temperature in the vicinity of absolute zero. A conductive sample is placed in this UHV chamber and serves as a base electrode with respect to a fine conductive tip that serves as a scanning electrode. The scanning electrode is poised above the base electrode at a distance of only a few Angstroms.

A well known method for investigation of surface structures is by visual inspection with the human eye. However, there are natural boundaries for optical resolution with the naked eye. Optical instruments can be used to further improve optical resolution. However, even with the best optical instruments, limits are reached which are imposed by the nature of light.

Resolution can be further improved using apparatus operating with radiation of effective wave-length which is shorter than visible light, such as the electron microscope. However, more complicated apparatus is needed because an electron microscope operates in a vacuum and the results of the inspection must be made visible on a screen or photosensitive layer. In comparison with optical microscopes, lateral resolution is improved remarkably. However, vertical resolution again soon reaches a limit.

Apparatus for investigation of surface structures operates either with electromagnetic radiation or with a corpuscular radiation interacting with the surface of the sample. Strictly speaking, instruments capable of resolving fields in the atomic or molecular range do not image a surface in the sense of producing an image for visual inspection. However, such instruments do give information sufficient to allow conclusions to be made about the structure and composition of the surface of the sample. For example apparatus exists for observation of selective diffraction of low energy electrons at a surface (LEED). Another apparatus uses secondary ion mass spectroscopy (SIMS).

The term microscopy is used where a surface is imaged with radiation of the same energy. Where radiation of different voltages of frequencies is used, i.e., with varying energy, the term spectroscopy is generally used. Dual purpose instruments are usually called microscopes even if they allow spectroscopic investigations as well.

All these known instruments require that the surface investigations be made in a good vacuum of e.g., $10^{-10}$ Torr. Temperatures should be as low as possible in the cryogenic range. The particles used are free particles moving in a high vacuum under the influence of applied fields. These particles need to be freed previously, of course, by some cathode or ion source.

In a atomic system or in a solid body, if charged particles are subjected to an interaction composed of a long range repelling component and a short range attractive component, then the resulting force builds a potential wall or a barrier. According to classical conceptions such a barrier can be crossed only by particles having energy greater than the barrier. There are nevertheless always a finite number of particles by a potential barrier which are capable of crossing the potential barrier even though they do not have sufficient energy. In a sense, they undercross the potential barrier via a tunnel. This so-called tunnel effect can be explained only by wave mechanics. Atomic particles have a two-fold nature in that only part of their properties can be explained by particle mechanics, another part of their properties being interpreted only by the wave concept. The tunnel effect is a wave property comparable in a sense with the wave matching phenomenon at an interface between different media.

According to the tunnel effect there exists a calculable probability that a finite number of electrons bound by a potential can cross the tunnel barrier even at low voltage differences. A tunnel barrier may be provided by a thin layer in a solid body. A high vacuum may also represent a tunnel barrier when the high vacuum distance to be crossed is between a few and several hundred Angstroms. Some bound electrons are capable of tunneling through such distances. In experiments with vacuum tunnel barriers a very weak tunneling current has flowed from a fine conductive tip to a flat counter electrode when the tip is posed above the counter electrode within a small distance. However, known experiments have needed expensive apparatus and have required a lot of time due to considerable technical difficulties. Many hours have been needed to get a single measuring point. A series of measurements has required several days.

Experiments with field electron emission also have been carried out wherein a fine tip serves as an electron source or as a so-called cold cathode. Here the tunnel effect is utilized only to free electrons from the metal of the tip into the vacuum. Under the influence of a strong electrical field, electrons are freed from the emitting tip and are accelerated towards and kind of imaged upon a screen or photosensitive layer. The distances traveled in the vacuum by the electrons are considerably longer than the required short distance within which the vacuum tunnel effect is possible with bound electrons.

The object of this invention is to provide a new instrument for investigation of surface structures of highest resolution which utilizes the vacuum tunnel effect. Therefore, the apparatus is operating only with electrons bound by a potential. Information about the surface of the sample being investigated preferably should be available in a relatively short time.

These objects are met by the scanning tunneling microscope described herein.

In order to implement such an instrument, considerable technical difficulties must be overcome. The apparatus must operate in a ultra-high vacuum of better than $10^{-10}$ Torr. Furthermore, the temperature should be as close to absolute zero as possible. This means cryogenic temperatures lower than liquid helium temperature of 4.2 K. The operating temperature should be lower than 1 K. and preferably lower than 0.3 K. Under these extreme conditions, position adjusting drives should still operate and have a sensitivity on the order of Angstroms. The drives should also be capable of being positioned accurately and reproducibly. A vertical drive is especially difficult to implement. On the one hand it must move in a relatively coarse fashion over a distance in the range of millimeters at the beginning of an investigation, when the apparatus is loaded with a sample to be investigated. But during the actual investigation it must be capable of operating very finely with an accuracy on the order of fractions of an Angstrom. Special attention should be directed towards obtaining absolute freedom from vibrations. Thermal fluctuations, which normally produce variations on the order of magnitude of Angstroms, and hence in the order of magnitude of the operating range of the instrument, have already been substantially removed by the extreme cooling down. However, every sound pulse, no matter how small, will generate a disturbing elastic wave within the material. Therefore, an optimal suspension or support of the essential parts of the instrument is very important.

The present invention for investigation of surface structures will now be described in more detail with the aid of the drawings in which:

FIG. 1 shows schematically a block diagram of the essential parts of the apparatus for investigation of surface structures according to the invention.

FIG. 2 is used to illustrate the tunnel effect through a barrier between two metals.

FIG. 3 shows graphically the strong dependence of vacuum tunnel effect tunneling current upon barrier dimensions.

FIG. 4 illustrates a scan in the lateral direction while controlling the tip distance above the sample surface during the scan.

FIG. 5 illustrates repeated lateral scanning of the probed surface with parallel raster scan lines.

FIG. 6 shows schematically a practical 3-dimensional plot of the investigation results either as values of the tip position or as the proportional piezo voltages of the piezo drives.

FIG. 7 illustrates the principle of an additional variation or modulation in the vertical distance of the scanning tip during a scan to get additional information, such as possible change in the work function of the sample surface.

FIG. 8 shows schematically a practical plot of the additional information obtained in accordance with the principle described in connection with FIG. 7.

FIG. 9 shows a comparative review of resolution limits of the human eye, of several microscopes and of the scanning tunneling microscope according to the invention.

FIG. 10 shows a possible arrangement of the piezo drives in the lateral directions.

FIG. 11 shows a vertical piezo drive suitable for coarse adjustment as well as for fine adjustment.

FIG. 11.1 schematically shows drive signal pulses used for coarse adjustment of the piezo drive illustrated in FIG. 11.

FIG. 12 shows a perspective view of a section of the trough-like guide member of the vertical piezo drive shown in FIG. 11.

Figure 13:
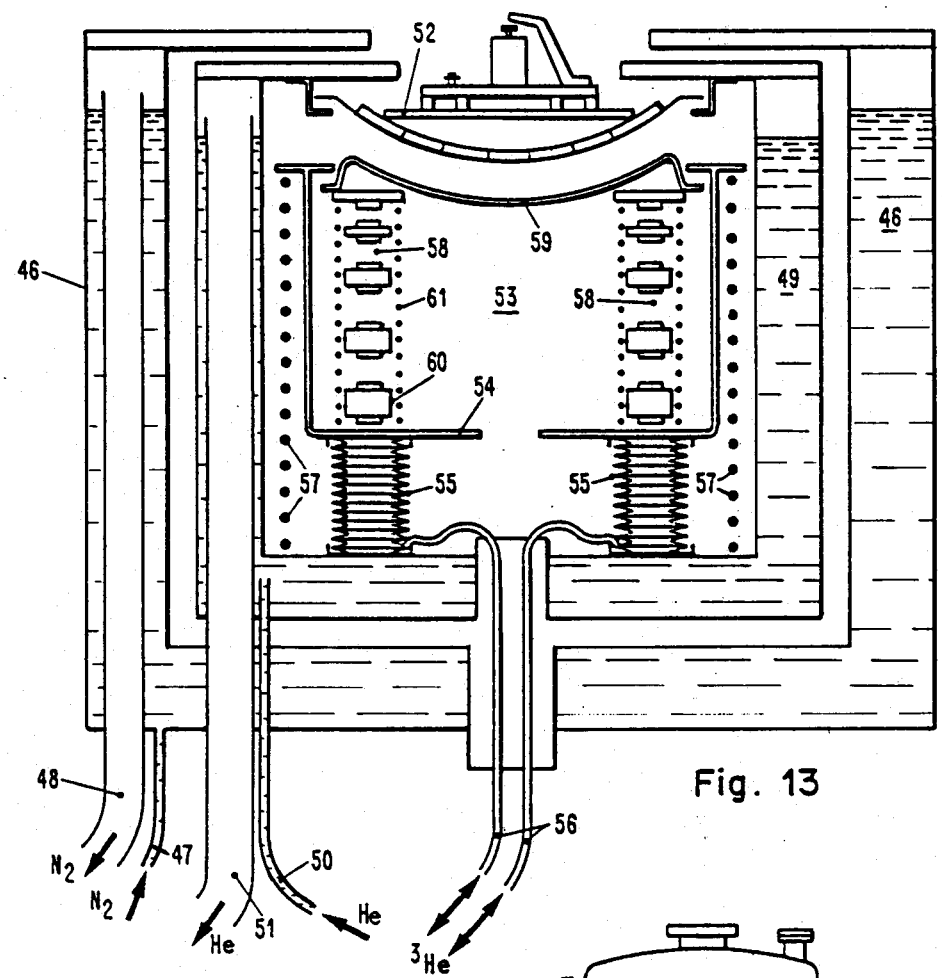

FIG. 13 shows a vertical section of the inner parts of the apparatus and illustrates a vibration free suspension.

Figure 14:
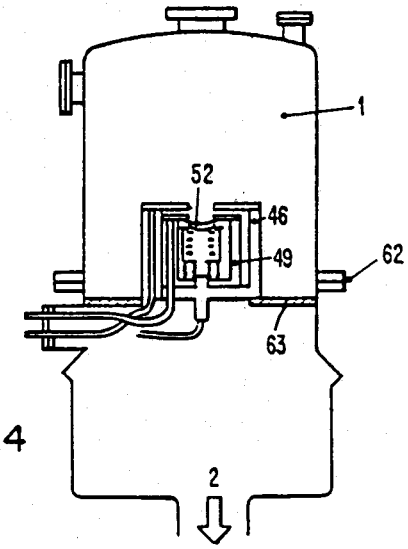

FIG. 14 shows a vertical section of the high vacuum chamber and the inner parts of the apparatus.

The block diagram of FIG. 1 shows the essential parts of the new instrument for investigation of surface structures. An ultra-high vacuum chamber 1 comprises means for generating a high vacuum better than $10^{-10}$ Torr. This means is generally shown as vacuum pump 2, even though in reality it may include several pumps or other equipment. A cryogenic source 3 cools the ultra-high vacuum chamber 1. Any suitable device may serve as a cryogenic source. In order to reach temperatures as low as possible preferably either a liquid helium or a dilution refrigerator is used operating with both helium isotopes $^3$He and $^4$He. An outer liquid nitrogen jacket provides pre-cooling. A sample 4 acts as a base electrode above which a tip 5 is poised at only a short distance away. Both electrodes are drawn schematically in exaggerated size. Relative to each other they can be moved in three dimensions. Symbolically, this is shown by three axes crossing rectangularly and designated by x, y and z. The electrodes are further provided with three piezo drives 6, 7 and 8. Piezo drives 6 and 7 operate in lateral dimensions x and y. For example, they may act on sample 4 and move it relative to tip 5. Alternatively, sample 4 may be fixed, and both lateral drives 6 and 7 act on tip 5. Vertical drive 8 adjusts the relative position of the electrodes in the z dimension.

Apparatus for supplying energy and coolants, and means for control of the instrument and for analyzing and indicating the investigation results, are all located outside of the ultra-high vacuum chamber 1. Some of the essential parts of this apparatus are shown in FIG. 1. Measuring equipment 9 is part of the electronic control means and is connected to the electrodes, i.e., to sample 4 and to tip 5, as well as to piezo drives 6, 7 and 8. A control means 10 is connected to the measuring equipment 9 and acts upon the vertical drive 8. Measuring equipment 9 is connected to analyzing means 11 which in turn is connected e.g., to a plotter 12 and to a viewing screen 13.

The mechanical dimensions of the electrodes, sample and tip, as well as their possible ranges of adjustment are extraordinarily tiny because of the delicate nature of the vacuum tunnel effect. Electronic control equipment needs to be able to operate very precisely and the measuring equipment must be extremely sensitive. In a vacuum, the barrier to be crossed by bound electrons by tunneling lies in the order of magnitude of about 10 Å (1 nm) to 100 Å (10 nm). The tip electrode is moved above the sample at a distance from the sample of about the same order of magnitude. It may not strike against the sample and thus make conductive contact. It also may not get so far away from the surface of the sample that pure tunneling currents are no longer possible. The current density of the tunneling currents is on the order of 100 Å cm$^{-2}$. However, due to the extraordinarily small dimensions, the tuneling currents which flow in reality are only about $10^{-10}$ Å. The tip's radius of curvature in this case is in the order of magnitude of 1000 Å (100 nm). By calculation it can be shown that about half of the tunneling current flows through a central region between the tip and sample having a diameter of only about 100 Å (10 nm). In the outer direction, the current density decreases rapidly. Thus, the tunneling microscope has a kind of "focus" with a radius of about 50 Å (5 nm). In the lateral dimension the tip therefore should be moved across the sample surface in steps which are not greater than 50 Å (5 nm).

Individual single steps may be shorter because overlapping measuring points still contain analyzable information.

The vertical drive should have higher accuracy because tunneling current varies very strongly with the z dimension. The tunneling probability, and hence, the tunneling current depends exponentially upon the electrode distance. Therefore, the accuracy should be at least 0.1 Å (0.01 in order to guarantee a vertical resolution in the order of magnitude of 1 Å (0.1 nm).

The drive means should be not only adjustable over small distances in all dimensions, but set positions should also be definite and reproducible. The drives should also be reliable in ultra-high vacuum, and should be operable at temperatures close to absolute zero. Drive means meeting such conditions are for instance piezo drives. In three coordinates the exact position of tip 5 is known from the values set, i.e., from the piezo voltages.

In physical experiments one can measure tunneling current at a defined applied voltage, wherefrom one can derive the tunnel resistance of the vacuum tunnel barrier for a certain combination of electrodes as a function of the spatial coordinates. The new instrument for investigation of surface structures not only delivers data about individual measuring points but also gives information about a whole area of a sample surface within a short time period. It operates much like a scanning microscope. The sample surface is investigated in raster lines one after the other, and the whole image is composed of the scanning lines of the scanning pattern. During the scan the drive means of a first lateral dimension is operating for a raster line, while the drive means of the transverse other lateral dimension is kept fixed. After a lateral shift of about a line width, the next line is scanned by the first drive means and so forth.

While scanning with a tip poised above a sample surface a certain danger exists of making inadvertent contact between the tip and sample because roughness of the surface may be on the order of magnitude of the vacuum tunnel barrier and therefore also of the vertical distance of the tip above the sample. Such involuntary contact should be avoided. This instrument avoids such danger automatically while operating in the scanning tunneling microscope mode. The scan operation is defined in the lateral dimensions. However, the tip's vertical distance is variable. The measuring method itself, or the control method, automatically keeps a correct distance between the tip and the sample surface. By continuously measuring tunnel effect parameters, such as tunneling current and applied tunneling voltage, the tunnel resistance can be determined at all times as the ratio thereof. The operation can be conducted such that the voltage applied to the electrodes is kept constant by fine adjustment of the tip's vertical distance above the sample. Alternatively, the tunneling current can be controlled to a desired value at all times. With suitable control equipment the tip to surface distance also can be controlled directly to produce a constant tunnel resistance. Other electrical parameters proportional to the tunnel resistance may be used instead for control of tip to surface distance. Applied voltage may possibly be used to control the vertical distance of the instrument if tunneling current is kept constant. In every case the instrument is controlled during scan in a lateral dimension according to an electrical variable which is proportional to the tunnel resistance. A tunnel effect variable is measured and kept constant by fine adjustment of the vertical drive in the z dimension by means of a closed loop control system.

The scanning pattern is preferably a line raster whereby the area is scanned in a first lateral dimension (x) in straight parallel lines, one after the other. The second lateral dimension (y) is the other scanning parameter. The vertical distance (dimension z) is controlled with a feedback system in accordance with the measured variable which is proportional to the tunnel resistance. Since the position of a piezo drive is proportional to the piezo voltage, or to the respective drive current, the drive currents of the three piezo electrical drive means represent values equivalent to the position of the tip in each dimension. Generally, the coordinates are cartesian coordinates with three orthogonal axes. However, curved scanning is measured and kept constant by fine adjustment of lines are also permitted, if they are reproducible.

Data analysis is made as a three dimensional representation. Both lateral dimensions can easily be shown on a plotter 12 or on a viewing screen of screen device 13. A suitable representation must be chosen, however, for the third dimension. One possibility is to represent the measuring values as a set or family of curves x(z) as a function of the parameter y. Another possibility is to show the z values as brightness steps at point x,y. A corresponding graphical representation may comprise points with different areas of other symbols. When the representation occurs on a screen, the brightness of the cathode ray tube may be controlled according to the values of the third dimension.

The tip passes across the surface of the sample at a vertical distance such that during scan the tunnel resistance of the vacuum tunnel barrier is controlled to a constant value. The thickness of the vacuum tunnel barrier remains constant if the work function of the sample material is locally constant. This means that during the scanning movement, the tip is following all unevenness and roughness of the sample surface at a constant distance therefrom. The drive current of the vertical drive means thus is a true image of the surface structure. The image produced by the scanning tunneling microscope is an extremely enlarged image of the sample surface, provided the sample's work function is constant.

This new instrument also can provide valuable surface information when the work function of the sample is not locally constant. Work function variation may be caused e.g., by enclosures in the sample material, by oxide layers, by adsorbants or by other disturbances of the material. The measuring method can be improved in various ways. For example, a superimposed mechanical modulation of the tip's distance in combination with a suitable frequency or phase dependent measuring method will detect variations in the tunneling current with respect to the z dimension. Conclusions may be drawn from such tunneling current variation as to variations of the work function of the sample.

Normally, conduction electrons are able to leave a metal if they fullfill the work function $\Phi$, which is on the order of several electron volts, e.g., of about 5 eV. In the energy diagram shown in FIG. 2, the electrons of a first metal are bound in a first potential well 14, and there they occupy the lowest energy states or levels, as indicated by hatching. A second metal is characterized by a second potential well 15 separated from the first potential well 14 by a potential barrier 16. Generally, this potential barrier 16 cannot be crossed by the electrons. Electrons are able to leave the first metal and enter into a vacuum when their energy E is raised to the value of the upper limit of the bound energy states plus the work function $\Phi$, the so-called emission edge 17. Electrons having at least such energy are emitted from the metal, and can move freely in the vacuum as free electrons. They are then able to reach the second metal at any time and can later occupy the lower energy states indicated by the hatching at the bottom of the second potential well 15. According to the classical particle concept, no electrons of the first metal can reach the second metal without energy being supplied to it equal to at least the amount of the work function $\Phi$, the barrier thickness d and atomic natural constants, a current of bound electrons of the first metal can reach the second metal without energy sufficient to overstep the potential barrier 16 and hence, the emission edge 17. Some of this so-called tunneling current already flows when a small energy difference or potential difference exists between the first metal and the second metal. In FIG. 2 the first potential well 14 appears a little bit raised in comparison with the second potential well 15. This can be caused by a small electrical voltage occurring between both metals. An energy difference of only 1 meV corresponds to a thermal stimulation of 11.6K. Arrow 18 symbolizes the tunneling current flowing from the first to the second metal. To avoid thermal stimulation of conduction electrons, the temperature should be as low as possible and close to absolute zero.

Tunneling probability depends very strongly upon the barrier thickness. As represented graphically in FIG. 3, tunneling current I versus the barrier thickness d is an exponential function. In the related formula all atomic natural constants are combined and represented by constant a. The exponent is the negative product of the square root of the work function $\Phi$, the barrier thickness d and the constant a. This formula is valid also for a vacuum tunnel barrier. It follows that with a locally constant work function $\Phi$, the signal of the scanning tunneling microscope is a true image of the sample surface structure.

FIG. 4 shows schematically and very much enlarged the scanning of a sample 4 in a lateral dimension by a tip 5 poised above the surface of the sample by a distance corresponding to the vacuum tunnel barrier. Tunneling current is flowing through the vacuum between the electrodes. The direction of tip movement 19 may correspond to the x dimension for example. The vertical distance of tip 5 above the sample surface may be on the order of about 20 Å (2 nm). Unevenness and roughness of the sample surface has a magnitude of about the same order. If the vertical distance between the tip and the structure of the sample surface were not automatically controlled during scanning movement, a step of only one atomic layer would already severely affect results. Control of the vertical position of the tip is indicated in the figure by the double-headed arrow 20. During scan in direction 19, the tip 5 is continuously controlled by piezo drive 8 according to electrical parameters measured. The drive current or piezo voltage of the vertical drive means is measured as the independent variable. This signal is used or analyzed to represent the sample surface structure being investigated.

After completing the scanning of a raster line in a first lateral dimension (x), the tip 5 is shifted in the transverse second lateral dimension (y) by about the thickness of a raster line. Subsequently, another raster line is scanned parallel to that first line. By repeated lateral scanning of parallel raster lines, the whole sample surface will be scanned line by line. In FIG. 5 both electrodes 4 and 5 are schematically shown much enlarged. At the sample surface the dashed line indicates the path of the shadow of tip 5 over the surface of the sample 4. The dotted line indicates the path of the tip itself at a distance over the surface determined by the vacuum tunnel barrier thickness. The axis system x,y,z indicates the coordinates of the dimensions. For example, scanning may occur in the x dimension. Between repeated scans, the tip is shifted in the y dimension about the thickness of a raster line in each case. Fine adjustment by the vertical drive means automatically controls the z dimension position of the tip so as to maintain a constant tunnel resistance. The results of the scanning tunneling microscope scan are displayed by plotting the drive currents or piezo voltages as a set of curves representing three dimensions. These measured currents or voltages correspond to the position dimensions of the fine tip 5 in three coordinate directions. For example, FIG. 6 shows the z direction piezo voltage Vz as a function of the x direction piezo voltage Vx for each of a family of different y direction piezo voltages Vy. If the work function $\Phi$ of the sample material is constant over the scanned region, the vacuum tunnel barrier is also constant so that the tunnel resistance may be kept constant too. When the work function is constant, the scanning tip follows the sample surface at a constant vertical distance. The family of curves of FIG. 6 is then a true enlarged image of the sample surface structure.

When there is a local variation in the work function $\Phi$ of the sample, the vacuum tunnel barrier thickness varies even though the tunnel resistance is held constant. Therefore, the vertical position coordinate of the scanning tip does not exactly correspond to the structure of the sample surface. Changes in work function of the sample during the scan can be detected by modifying the measuring method and analysis. Similar to FIG. 4, FIG. 7 illustrates scanning of the surface of sample 4 by tip 5 in a lateral dimension. Similar designations have the same meaning. Here the sample 4 has a relatively smooth surface. However, it contains an inhomogeneity 21 at which the work function $\Phi$ changes. When tip 5 moving in direction 19 reaches inhomogeneity 21, the tunnel barrier thickness changes even though the tunnel resistance is kept constant by the automatic control system. The dashed line marks the position of the scanning tip during the scan and shows the change in level when it passes inhomogeneity 21. To get additional information about possible change in work function $\Phi$, a superimposed periodic movement in the vertical direction is applied to the scanning tip 5. This distance variation or modulation of the scanning tip occurs e.g., at 100 Hz. From FIG. 3 it can be seen that the tunneling current I has an exponential dependence upon barrier thickness d and that the square root of the work function $\Phi$ appears in the exponent.

A change in barrier thickness caused by a change in the work function can be detected from the change in tunneling current during variation of the distance between the tip and measured surface. The z coordinate is modulated about a mean value corresponding to a constant tunnel resistance, which is determined by the automatic control system. The modulation amplitude is constant or at least known. The derivative of the tunneling current I with respect to the vertical deflection in the z direction has as a factor the square root of the work function.

Since other variables in this derivative can be regarded as constant at a measuring point in a first approximation, the variation of tunneling current with the z distance variation dI/dz is essentially proportional to the square root of the work function $\sqrt{\Phi}$. The signal generated by the additional modulation can be filtered out and analyzed separately using a phase and frequency selective amplifier, sometimes called a block-in amplifier. It may be advisable to mathematically square these measuring values because the square of dI/dz is practically proportional to the work function $\Phi$. FIG. 8 illustrates a possible way of displaying these results. On a second plotter or a second viewing screen the work function $\Phi$ is plotted as a function of x direction piezo voltages Vx for each of a family of different y direction piezo voltages Vy. In FIG. 7 the large double-headed arrow 20 indicates the z position variation of tip 5 necessary to maintain constant tunnel resistance, while the additional variation in the vertical distance of the tip 5 is indicated by the small double-headed arrow 22.

This new scanning tunneling microscope exhibits an extraordinarily good resolving power. FIG. 9 compares the resolution limits of some kinds of microscopes with the human eye. Lateral resolution is indicated along the abscissa and is in the range of $10^9$ Å through 1 Å ($10^8$ nm through 0.1 nm). The ordinate corresponds to vertical resolution in the range of about $10^9$ Å through $10^{-2}$ Å ($10^8$ nm through $10^{-3}$ nm). The resolution limits 23 of the human eye are shown lying in the range of about $10^9$ Å through $10^6$ Å of lateral resolution and $10^9$ Å through $10^7$ Å of vertical resolution. Roughly three power ranges of microscopes may be defined. Between about $10^7$ Å through $10^4$ Å lateral and $10^6$ Å through 10 Å vertical there are located different kinds of optical microscopes 24 through 28. The most unfavorable instruments are the simple low power optical microscopes 24 having a numeric aperture of about 0.1. High power optical microscopes 25 with numeric aperture of about 0.4 show a better lateral resolution. The better vertical resolution is shown by instruments such as multiple-beam interferometers 26, differential interference microscopes 27 or phase-contrast microscopes 28. Electron microscopes are located between about $10^5$ Å through 10 Å lateral and $10^6$ Å through $10^2$ Å vertical. The electron microscope 29 covers the largest range of lateral resolution as yet available. The scanning electron microscope 30 is better with respect to vertical resolution. The scanning tunneling microscope 31 according to this invention covers practically the whole range of $10^8$ Å through $10^2$ Å lateral and $10^7$ Å through $10^{-1}$ Å vertical. It should be noted especially that vertical resolution such as this has not been achieved yet by any other instrument.

Piezo electric drive means can be fabricated from disks of piezo ceramic. Such disks are covered on both sides with metallic coatings to form electrodes. Each disk is cut such that an applied positive electrical field causes an elongation in the direction of the thickness dimension and a contraction in all other directions. Depending upon the design, the metal layer on one side may be divided into separate electrodes while the metal layer on the other side may be continuous and function as a common ground electrode. Drive currents may be applied to the electrodes by sliding contacts. FIG. 10 shows an example of a lateral drive means. An L-shaped piece 32 with rectangular legs is cut from a ceramic disk. The upper surface is provided with two electrodes 33, 34. One end 35 of the device is immobile. Drive currents applied to the first electrode 33 cause a proportional elongation or contraction of the associated leg in the x dimension. This causes also a shift of the other leg parallel to itself. Drive currents applied to the other electrode 34 cause a proportional elongation or contraction of the other leg in the y dimension. Using both of these lateral drive means, the free end 36 of the other leg may be positioned with respect to both the x and y coordinates. Sample 4 may be attached to free end 36, for example, while the scanning tip 5 is attached to a z direction drive. The vertical z direction drive means in this case has a fixed position in other directions. However, it is also possible to mount the z direction drive means onto the free end 36. In this case, sample 4 could be fixed in position while tip 5 is attached to the free end of the z direction drive means and scans in all three coordinate directions.

FIGS. 11, 11.1 and 12 illustrate a z direction adjusting means. This device can be adjusted in a relatively coarse manner over a vertical distance of several millimeters. This is necessary to be able to load the instrument with a sample at the beginning of an investigation. This vertical distance drive also can be adjusted very precisely during actual scan of the sample surface. A piezo ceramic piece 38 moves in the z direction in a worm-like manner along a trough-like guide member 37. The edges 39 of the guide member 37 are parallel to each other. Guide member 37 is somewhat flexible because of the longitudinal notch 40. Thus, at every temperature and even when submerged in liquid helium, edges 39 slidably support the legs of the shaped piece 38. In plan view shaped piece 38 appears essentially H-shaped. Two pairs of legs are guided by notches in edges 39 of guide member 37. The body of the shaped piece 38, corresponding to the crossbeam of the H, moves longitudinally along the middle of guide member 37. Head 41 is an extension of the H crossbeam and carries scanning tip 5.

The lower side of shaped piece 38 is covered with a continuous metallization acting as a common electrode. Drive electrodes 42, 43 and 44 cover corresponding parts of the shaped piece 38 and serve to produce worm-like movement when 4-phase drive currents are applied. The hind legs carry the drive electrode 42, the body is covered with the drive electrode 43 and the fore legs are carrying the drive electrode 44. The head 41 bears a fine adjustment electrode 45. The front end carries the scanning tip 5. The drive signal waveforms comprise pulses of about 1000 V with a repetition rate of 100 Hz. The waveforms are illustrated in FIG. 11.1 where subscript numbers correspond to the respective drive electrodes. Drive signals $V_{42}$ and $V_{44}$ applied to drive electrodes 42 and 44 respectively are opposite in phase. They cause a pair of legs to contract and therefore becomes loose within the guide notches while the other pair of legs expands and therefore becomes tight within the guide notches. The drive signal applied to drive electrode 43 of the body causes alternate contraction or elongation of the body. It overlaps either the leading edge or the trailing edge of drive pulses applied to a pair of legs. Depending upon the phase relationship of the series of drive signals the drive member 38 moves in worm-like fashion in the z direction in one or in the other direction.

When coarse adjustment is finished in single steps of 10 Å to 30 Å over an adjustment range on the order of millimeters, the periodic drive signals $V_{42}$, $V_{43}$ and $V_{44}$ are switched off and the legs of the shaped piece 38 are clamped firmly in the guide notches. Now fine adjustment occurs by applying analog drive currents to drive electrode 45. The trough-like guide member 37 may be made of stainless steel. Both edges 39 may be fabricated of ceramic material. As can be seen from the perspective view of FIG. 12 edges 39 may be attached to the guide member 37 by screws.

The inner parts of the apparatus are well cooled and well suspended in an ultra-high vacuum chamber. A schematic view is shown in FIG. 13. For example, an outer cooling jacket 46 may be provided which may be filled with liquid nitrogen to an upper level via an inlet 47. Gaseous nitrogen exits via a larger outlet 48. This first cryostat may also include additional equipment which is not shown. An inner cooling jacket 49 contains liquid helium. Preferably this cooling vessel is designed as a dilution refrigerator operating with both helium isotopes $^3$He and $^4$He. However, only a thin liquid helium inlet 50 and a thicker gaseous helium outlet 51 is shown for simplicity. Additional optional components associated with operation and control of this second cryostat are omitted. A hovering support 52 suspends the sample to be investigated, the scanning tip with its drive means and the first stages of electronic equipment for analysis such as measuring amplifiers, for example.

Two contradictory requirements must be fulfilled for operation of the instrument. On the one hand heat must be removed from the inner parts to achieve a very low temperature. This is possible only by convection, which suggests a dense packaging of metallic parts. On the other hand, the arrangement 52 on the hovering support must be suspended completely free of vibration. This forbids a dense packaging of mechanical parts. FIG. 13 illustrates a possible solution.

Coarse adjustment mechanism 53 serves both purposes. Inside of cooling jacket 49 a pot 54 is movable in the vertical direction and is positioned by three metal bellows 55. Metal bellows 55 are filled with sufficient pressure to lift pot 54 using preferably a gas which stays gaseous at an operating temperature below 1 K. The helium isotope $^3$He has proven to be suitable at such temperatures. Helium pipes 56 are connected from level control means (not shown) to the metal bellows 55. A large helical spring 57 is positioned between pot 54 and inner cooling jacket 49. Since the apparatus is arranged in a vacuum, outer air pressure is so low that metal bellows 55 might not collapse when internal pressure is reduced except for the additional return force supplied by helical spring 57.

Several columns 58 within pot 54 carry a calotte-shaped superconducting tray 59 of niobium. Each column 58 comprises a series of oscillating members of different eigen frequency. The eigen frequencies of the oscillating members are mistuned with respect to each other and chosen such that no sound pulse will be transferred to the inner parts of the apparatus, e.g., from an operating turbopump. The different masses of the oscillating members comprise metal blocks 60, which are very heat conducting, e.g., made of copper. Each of the metal blocks 60 carry feet which mate with corresponding feet on adjacent metal blocks 60 to provide heat conducting contact when they are brought into contact during operation of the coarse adjustment mechanism 53. This quickly drains heat from the apparatus when it is being cooled down. Each column 58 contains a row of spiral springs 61 which connect individual oscillating members to each other, each oscillating member comprising a spring and metal block. The top and bottom of each column 58 are acoustically mismatched. They are suspended, for example, in glass wadding to minimize transfer of sound.

The hovering support of the arrangement 52 has a lower surface with a shape that matches the calotte-shaped superconductive tray 59. The lower surface contains a large number of permanent magnets. When the tray 59 has become superconducting at a low temperature, arrangement 52 hovers above the tray. Every virtual movement of the hovering support generates strong currents within the superconductor, which generates a magnetic counter field that keeps the arrangement 52 hovering. The equilibrium state is stable due to the form of a calotte. Disturbing sound pulses are not transferred through the intermediate space because it is a vacuum.

The described coarse adjustment mechanism 53 fulfills both basic requirements described above. For cooling down the apparatus, metal blocks 60 of the columns 58 are brought into heat conducting contact with each other. During operation of the scanning tunneling microscope, the columns 58 are elongated so that superconducting tray 59 is lifted to a position where arrangement 52 hovers. Excessive movement of the coarse adjustment mechanism 53 is limited by stops. When mechanism 53 is in a low position or tray 59 is not superconducting, arrangement 52 is prevented from dropping also by stops.

FIG. 14 is a cross-sectional view of the ultra-high vacuum chamber. Similar reference numbers again refer to similar parts. Ultra-high vacuum chamber 1 is a cylindrical steel vessel. An intermediate flange 62 allows separation of the bell jar upper part. The inner parts of the apparatus are arranged on an annular girder 63 located in the lower part near to the upper edge thereof. The upper part is essentially a vacuum bell jar with observation windows and with closable stubs. The lower part is firmly mounted. It contains a number of feed-throughs for supply lines and a port connected to a pumping means located in the direction of arrow 2. In the upper part of the ultra-high vacuum chamber 1 there is sufficient space also to provide other surface structure investigation instruments in addition to the scanning tunneling microscope. Thus, the same sample may be simultaneously investigated in different ways. For example, another instrument which also needs ultra-high vacuum and low temperatures is the spectroscope which analyzes scattered or diffracted electrons, X-rays or corpuscular radiation.

Having thus described our invention, what we claim as new, and desire to secure by Letters Patent is:

1. Apparatus for investigating surface structures utilizing the vacuum tunnel effect, comprising:
   an ultra-high vacuum chamber which can be cooled down to a temperature close to absolute zero;
   a fine conducting tip in said chamber;
   means for positioning a conductive sample surface in said chamber sufficiently close to said conducting tip that tunnelling current flows between said tip and the sample surface;
   means for scanning said tip across the sample surface at a tunneling distance while tunnelling current flows between said tip and the sample surface;
   means for measuring a tunnel effect variable between said tip and the sample surface while said tip is scanned across the surface;
   means for automatically controlling the separation distance between said tip and the sample surface in response to the measured tunnel effect variable such that the measured tunnel effect variable remains substantially constant during scanning; and
   means for graphically displaying the spatial coordinates of said scanning tip to produce a topological map of said surface.

2. Apparatus as defined in claim 1 wherein said means for positioning comprises a piezo electric drive means acting in the direction along which the separation distance between said tip and said sample surface is controlled, said direction being the z direction.

3. Apparatus as defined in claim 2 wherein said piezo electric z direction drive means comprises a piece (38) of piezo ceramic having hind legs, a body, fore legs, and a head, a first electrode (42) covering said hind legs, a second electrode (43) covering said body, a third electrode (44) covering said fore legs, a fourth electrode (45) covering said head, said hind and fore legs being guided along parallel notches in a guide member (37), coarse adjustment in the z direction being achieved by applying drive currents of different phases to said first, second and third electrodes, whereby said hind legs and fore legs alternately loosen and clamp to said guide member and said body contracts and elongates thereby causing worm-like movement of said piece along said guide member, fine adjustment in the z direction being achieved by applying a drive current to said fourth electrode, said head carrying said tip.

4. Apparatus as defined in claim 2 wherein said means for scanning comprises piezo electric drive means acting in directions x and y, both being perpendicular to the z direction.

5. Apparatus as defined in claim 4 wherein said piezo electric x and y direction drive means comprises an L-shaped piece (32) of piezo ceramic having a first electrode (33) on one leg thereof and a second electrode (34) on the other leg thereof, one end of said piece being fixed while the other end thereof is free to move in the x and y directions by elongation or contraction of the legs in proportion to drive currents applied to said first and second electrodes.

6. Apparatus as defined in claim 4 wherein said ultra-high vacuum chamber contains a hovering support (52) which carries said tip, said z direction piezo electric drive means, said x and y direction piezo electric drive means and the sample to be scanned, said support being caused to hover due to the magnetic interaction of a plurality of permanent magnets carried by said support with a superconductive tray (59), said superconductive tray being positioned within an inner cooling jacket (49) for liquid helium and an outer cooling jacket (46) for liquid nitrogen, said inner and outer jackets and superconductive tray also being within said vacuum chamber.

7. Apparatus as defined in claim 4 wherein said means for graphically displaying the spatial coordinates comprises means for graphically displaying the drive current or voltage of the z direction piezo electric drive means as a function of the drive currents or voltages of the x and y direction piezo electric drive means.

8. Apparatus as defined in claim 2 wherein said means for automatically controlling the separation distance between said tip and the sample surface comprises a feedback system controlling said z direction piezo electric drive means in response to the measured tunnel effect variable.

9. Apparatus as defined in claim 1 wherein said measured tunnel effect variable is tunneling current.

10. Apparatus as defined in claim 1 wherein said measured tunnel effect variable is tunnel resistance derived as the ratio of tunneling voltage to tunnelling current.

11. Apparatus as defined in claim 1 wherein said measured tunnel effect variable is tunneling voltage.

12. Apparatus as defined in claim 1 wherein the separation distance between said tip and the sample surface is modulated about a mean value, said mean value being automatically controlled in response to the mean value of the measured tunnel effect variable such that the mean value of the measured tunnel effect variable remains constant during scanning, a phase and frequency selective amplifier monitoring the derivative of tunneling current with respect to said distance modulation for changes in surface work function.

* * * * *